United States Patent [19]
Choi

[11] Patent Number: 6,069,054
[45] Date of Patent: May 30, 2000

[54] METHOD FOR FORMING ISOLATION REGIONS SUBSEQUENT TO GATE FORMATION AND STRUCTURE THEREOF

[75] Inventor: Jeong Y. Choi, Palo Alto, Calif.

[73] Assignee: Integrated Device Technology, Inc., Santa Clara, Calif.

[21] Appl. No.: 08/997,604

[22] Filed: Dec. 23, 1997

[51] Int. Cl.[7] .................................................. H01L 21/76
[52] U.S. Cl. .......................................... 438/423; 438/528
[58] Field of Search ...................................... 438/423, 528

[56] References Cited

U.S. PATENT DOCUMENTS

| | | | |
|---|---|---|---|
| 4,437,225 | 3/1984 | Mizutani .............................. | 29/576 B |
| 4,683,637 | 8/1987 | Varker et al. ............................. | 437/63 |
| 4,700,454 | 10/1987 | Baerg et al. ............................. | 438/440 |
| 4,810,664 | 3/1989 | Kamins et al. ........................... | 438/59 |
| 5,032,535 | 7/1991 | Kamijo et al. ........................... | 437/44 |
| 5,114,872 | 5/1992 | Roselle et al. ........................... | 437/48 |
| 5,279,978 | 1/1994 | See et al. ................................. | 438/154 |
| 5,418,174 | 5/1995 | Kalnitsky ................................. | 438/440 |
| 5,460,983 | 10/1995 | Hodges et al. ......................... | 438/152 |
| 5,482,872 | 1/1996 | Wu ......................................... | 438/181 |
| 5,527,719 | 6/1996 | Park et al. .............................. | 437/25 |
| 5,610,088 | 3/1997 | Chang et al. ............................ | 437/34 |
| 5,612,239 | 3/1997 | Lin et al. ................................ | 437/44 |
| 5,612,249 | 3/1997 | Sun et al. ................................ | 437/69 |
| 5,712,173 | 1/1998 | Liu et al. ................................ | 438/297 |
| 5,733,813 | 3/1998 | Chen et al. ............................. | 438/440 |

OTHER PUBLICATIONS

Takayoshi Hayashi et al., "Formation of Abrupt Interfaces between Surface Silicon and Buried SiO$_2$ Layers by Very High Dose Oxygen–Ion Implanation," JPN. J.Appl. Phys., vol. 19 (1980), No. 5, pp. 1005–1006.

*Primary Examiner*—Charles Bowers
*Assistant Examiner*—David S Blum
*Attorney, Agent, or Firm*—Isabelle R. McAndrews

[57] ABSTRACT

Semiconductor devices are formed in a semiconductor substrate having an essentially planar upper surface. In some embodiments, implanted regions are formed in the substrate at a first predetermined depth by implantation of oxygen and/or nitrogen ions. In some embodiments buried implanted are formed in the substrate at a second predetermined depth, deeper than the first depth by implantation of oxygen and/or nitrogen ions. These implanted regions are converted to dielectric isolation regions and buried dielectric regions, respectively, by a high temperature anneal after formation of a gate structure.

11 Claims, 3 Drawing Sheets

METHOD FOR FORMING ISOLATION REGIONS SUBSEQUENT TO GATE FORMATION AND STRUCTURE THEREOF

RELATED APPLICATION

A related application entitled "ION IMPLANTATION FOR SCALABILITY OF ISOLATION IN AN INTEGRATED CIRCUIT", by the inventor of the present application, Attorney Docket No. M-4944, is filed concurrently herewith.

BACKGROUND

1. Field of the Invention

This invention relates generally to a method for fabricating semiconductor devices and the devices so formed, and specifically to a method for forming isolation regions after formation of a gate electrode and the semiconductor devices so formed.

2. Related Art

In the manufacture of high performance Metal On Semiconductor (MOS) and combined Bipolar and MOS (BiMOS) semiconductor devices, each individual device structure is typically electrically isolated from other device structures through an isolation region. Formation of such isolation regions generally falls into two major categories. The first category encompasses all of the variations of LOCOS (LOCal Oxidation of Silicon) and involves exposing silicon to an oxidizing atmosphere to form silicon oxide. The second category includes the various trench forming and filling isolation structures, and thus requires etching a portion of the substrate and then refilling the etched portion with a dielectric material.

The LOCOS methods all involve conversion of a portion of the silicon substrate to a silicon oxide film in an oxidizing atmosphere, typically steam at approximately 1000° C. (degrees Centigrade). This conversion or oxidation process is restricted to predetermined areas of the substrate through the use of an oxidation resistant layer overlying the substrate, where only the predetermined areas are exposed. However, despite their broad application, LOCOS based processes all have several drawbacks. The first of these drawbacks is the formation of a "Bird's Beak" region under a portion of the oxidation resistant layer or mask. While variations of the basic LOCOS process, in particular Poly-Buffer LOCOS (PBL), have served to reduce the size of the "Bird's Beak" region, "Bird's Beak" formation can still restrict the usefulness of such LOCOS processes for deep sub-micron devices (below about 0.5 $\mu$m (micron)). In addition, the formation of the "Bird's Beak" region creates stress in the silicon substrate as the nitride masking layer is separated from the substrate. Also, as thermal oxidation of silicon is the conversion of a volume of silicon to approximately two times that volume of silicon oxide, the resulting structure is non-planar. Finally, the various LOCOS processes suffer from oxide thinning. That is, the thickness of the oxide film grown in any specific isolation region decreases with decreasing isolation width. For example, a field oxide that is grown to a thickness of 400 nm (nanometers) above a 1.5 $\mu$m wide isolation region will be only 290 nm thick above a 0.8 $\mu$m isolation region, a reduction in thickness of more than 25%. In 0.2 $\mu$m isolation windows the thinning effect can be as large as 80%. Thus, the thickness of the isolation oxide formed can vary within a device. These drawbacks serve to limit the usefulness of LOCOS based isolation for semiconductor devices employing deep sub-micron design rules.

As a result, recent efforts have focused on trench isolation and in particular shallow trench isolation (STI) for semiconductor integrated circuits employing deep sub-micron design rules. STI eliminates two major problems of LOCOS type isolation schemes. First is the intrusion into active areas by the LOCOS "Bird's Beak". Thus, absent a "Bird's Beak" region, STI allows for smaller isolation spacing than that possible with LOCOS processes. In addition, as STI involves filling a photolithographically defined trench region with a dielectric material, oxide thinning is eliminated. Thus, STI allows for isolation regions of varying widths to be fabricated within a single circuit. However, STI process and structures have other drawbacks that limit their acceptance and usefulness for devices employing sub-micron design rules. Among these other drawbacks are the increased process complexity required to create such STI regions, inversion of vertical trench sidewalls of P-type active areas, less than adequate planarity of the resulting surface and stress induced by trench etching processes and by trench fill materials.

In addition to the physical requirement of smaller isolation region widths, deep sub-micron devices also require lower parasitic leakage currents and parasitic capacitance for optimum performance. One method for providing these lower leakage levels and capacitances is the formation of dielectrically isolated islands within a semiconductor substrate. For example, Varker et al. in U.S. Pat. No. 4,683,637 issued Aug. 4, 1987, form MOS transistors " . . . using the gate conductor to mask a high dose high energy implant which creates a thin dielectric region within the body of the common substrate beneath source and drain regions, but not beneath the channel region." (abstract). However, Varker et al. combines this thin dielectric region with lateral STI isolation regions. Thus while reducing parasitic leakage and capacitance, Varker et al. do not eliminate the above mentioned problems and drawbacks of such STI isolation regions.

Therefore, improved methods of forming isolation regions are needed for deep sub-micron semiconductor devices that will reduce and/or eliminate the effects of the problems associated with LOCOS or STI methods. In addition, these improved methods should result in an essentially planar device structure to enhance the manufacturability of such devices that employ deep sub-micron design rules. Improved methods, and structures thereof, are also needed that reduce or eliminate parasitic leakage and capacitance in such deep sub-micron semiconductor devices. Finally, the improved methods, and structures thereof, should provide reduced process complexity and manufacturing costs while resulting in increased device yields.

SUMMARY

In accordance with the present invention, improved semiconductor devices and methods of fabrication thereof are enabled. In embodiments of the present invention, a masking layer is formed and patterned to expose a first region of a semiconductor substrate. The first region is implanted with a first predetermined dose of oxygen ions, nitrogen ions or a combination thereof, at a predetermined energy level to create a predetermined concentration of the selected ion(s) within that first region. In some embodiments in accordance with the present invention, multiple implants at differing implant energies are used to distribute the implanted oxygen or nitrogen ions at different levels within the first region. The masking layer is removed and a gate electrode structure is formed overlying a portion of the region previously masked. The gate electrode structure having a gate electrode layer and gate dielectric layer, is as known.

In some embodiments of the present invention, subsequent to the formation of the gate electrode structure, the substrate is heated to a temperature sufficiently high to allow the implanted oxygen and/or nitrogen ions in the first region to form silicon oxide, silicon nitride or a silicon oxynitride, respectively. In this manner, the first regions are converted to dielectric regions within the semiconductor substrate that serve to isolate active regions from one another while an essentially planar substrate surface is maintained. In some embodiments, the substrate is heated in an inert atmosphere, while in other embodiments the substrate is heated in an atmosphere having trace amounts of oxygen.

After conversion of the first regions to isolation regions, source and drain (S/D) regions are formed aligned to these isolation regions and the gate electrode structure. S/D regions employing Lightly Doped Drain (LDD) regions, Graded Drain (GD) regions, Doubly Doped Drain (DDD) regions, or the like, are thus advantageously fabricated in accordance with embodiments of the present invention. In some embodiments of the present invention, one or more channel tailoring processes, for example a threshold voltage adjust implant to adjust the performance of the transistor formed, are performed subsequent to forming the isolation regions.

In other embodiments of the present invention, after forming the gate electrode structure, oxygen and/or nitrogen ions having a second predetermined dose are implanted into the substrate at a second predetermined energy to form a second implanted region within the substrate. In some embodiments, a masking layer is formed overlying the gate electrode prior to implantation to prevent implantation of the gate electrode layer. In some embodiments, the gate electrode layer is formed sufficiently thick so that an implanted region is formed within the gate electrode layer, but spaced a predetermined distance above the gate dielectric interface to allow for subsequent removal. In some embodiments, multiple implants at differing implant energies are used to distribute the implanted oxygen or nitrogen ions at different levels within the second implanted region in the substrate. In this manner, implanted second regions aligned to the gate electrode and contiguous with the first regions are formed within the semiconductor substrate at a predetermined depth from the substrate's surface.

After formation of the second implanted regions, the substrate is heated to a temperature sufficiently high to allow the implanted oxygen and/or nitrogen ions in the first and second regions to form silicon oxide, silicon nitride or silicon oxynitride, respectively. In some embodiments, the substrate is heated in an inert atmosphere, while in some embodiments substrate is heated in an atmosphere having trace amounts of oxygen. In this manner, the first and second regions are converted to a lateral isolation region and a contiguous buried isolation region, respectively, within the semiconductor substrate. After conversion of the first and second regions, S/D regions are formed aligned laterally to the lateral isolation region and the gate electrode structure, and vertically between the buried region and substrate surface. S/D regions employing LDD regions, GD regions, DDD regions or the like, are thus advantageously fabricated in accordance with embodiments of the present invention. In some embodiments of the present invention, one or more channel tailoring processes, for example a threshold voltage adjust implant is employed to adjust the performance of the transistor formed.

In some embodiments of the present invention, in lieu of or in addition to any channel tailoring processes that are employed, P-type and/or N-type well regions are formed. Such well regions are formed in the semiconductor substrate subsequent to the formation of the isolation regions and gate electrode structures and prior to formation of S/D regions. In this manner, twin-well Complimentary MOS (CMOS) and Bipolar MOS or CMOS (BiMOS or BiCMOS) integrated circuits can be formed.

BRIEF DESCRIPTION OF THE DRAWINGS

The present invention may be better understood, and its numerous objects, features, and advantages made apparent to those skilled in the art, by referencing the accompanying drawings. For ease of understanding and simplicity, elements common between illustrations are given common numbering.

DETAILED DESCRIPTION

As embodiments of the present invention are described with reference to the aforementioned drawings, various modifications or adaptations of the specific structures and/or methods may become apparent to those skilled in the art. All such modifications, adaptations, or variations that rely upon the teachings of the present invention, and through which these teachings have advanced the art, are considered to be within the spirit and scope of the present invention.

Figure 1A:
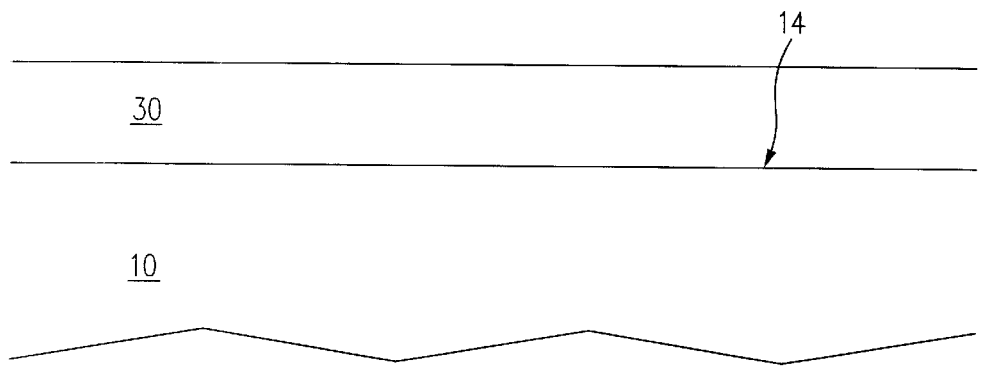
FIGS. 1A and 1B are cross-sectional views of early stages in the fabrication of embodiments of the present invention.

Referring to FIG. 1A, a semiconductor substrate at an early stage in the fabrication of a semiconductor device, e.g. a transistor, is depicted. A semiconductor substrate or wafer 10 is depicted having an implant masking layer 30 disposed on an upper surface 14. While wafer 10 is depicted in FIG. 1A as having a minimum of complexity, other types of substrates or wafers can be advantageously employed. For example, substrate 10 can be a single crystal N-type or P-type substrate, an N-type or P-type substrate encompassing an epitaxial layer (not shown) or any other appropriate type of substrate as is known.

Implant masking layer 30 is typically a silicon oxide, silicon nitride or oxynitride material formed by a chemical vapor deposition (CVD) or plasma enhanced CVD (PECVD) process. Where masking layer 30 is silicon oxide, in some embodiments layer 30 is conveniently formed using a thermal oxidation process. In some embodiments of the present invention an optional implant capping layer (not shown) is formed on surface 14 and implant masking layer 30 is formed overlying the optional capping layer. As known, such implant capping layers are often employed to prevent contamination of the substrate and/or to reduce the amount of both axial and planar channeling that can occur during an ion implantation process. Implant masking layer 30, and the optional capping layer where employed, are each formed having an appropriate thickness, as will be subsequently discussed.

Figure 1B:
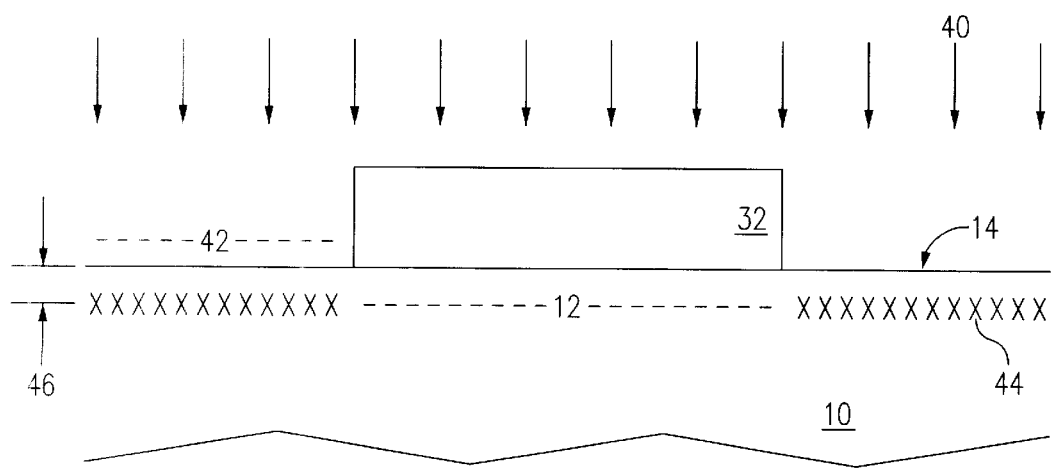

Turning now to FIG. 1B, an implant mask 32 is shown overlying an active area 12 of substrate 10 and exposing regions 42. Implant mask 32 and exposed regions 42 are conveniently formed by patterning and etching implant masking layer 30 (FIG. 1A) using conventional photolithographic and etch processing. In embodiments where the optional capping layer (not shown) is employed, typically the capping layer is formed of a material different than that employed for masking layer 30. For example, where masking layer 30 is a silicon nitride material a silicon oxide material can be used to form the capping layer. Thus, by forming masking layer 30 and the capping layer of different materials, layer 30 can be etched selectively with respect to the capping layer to define implant mask 32 while allowing the capping layer to remain overlying regions 42. Means for such selective etching are well known in the art.

Implanted regions 44 are formed by implanting ions 40 into exposed regions 42 of substrate 10, implant mask 32 serving to block implantation into underlying active area 12. Ions 40 encompass oxygen ($O^+$) ions, nitrogen ($N^+$) ions or a combination of $O^+$ and $N^+$ ions in sufficient quantity, or dose, to form dielectric isolation regions 48 (FIG. 2B), as will be discussed. In addition, an implant energy is used to implant ions 40 that is sufficient to position implanted regions 44 at predetermined depth 46 below surface 14 of substrate 10. With regard to the quantity of ions, or dose, it has been found that a dose in the range of $1.5$–$2.5 \times 10^{18}$ ions per square centimeter (ions/cm$^2$) is convenient. With regard to the implant energy, where depth 46 is predetermined to be, for example approximately 300 nanometers (nm), an energy exceeding 80 KeV (thousand electron volts) is appropriate, and approximately 100 KeV typical. In some embodiments of the present invention, multiple implants are used to create implanted regions 44. For example, implants at 25 KeV, 50 KeV and 100 KeV can be employed to distribute the dose of ions 40 over a wider range of depth 46 than possible with a single implant.

As one of ordinary skill in the art will know, for any specific implant energy employed, implant mask 32 need have a minimum thickness to block implantation of ions 40 into active area 12. For example, a thickness of approximately 150–250 nm is appropriate for implant mask 32 where an implant energy of 100 KeV is employed to implant ions 40. In embodiments where the optional capping layer is employed, it is desired that ions 40 pass through the capping layer to depth 46. Thus, the capping layer need be thin enough to allow implantation into regions 42 while protecting regions 42 from the aforementioned contamination and/or channeling. Thus, where the capping layer is employed, it has been found that a thickness of between 5–20 nm is appropriate.

Figure 2A:
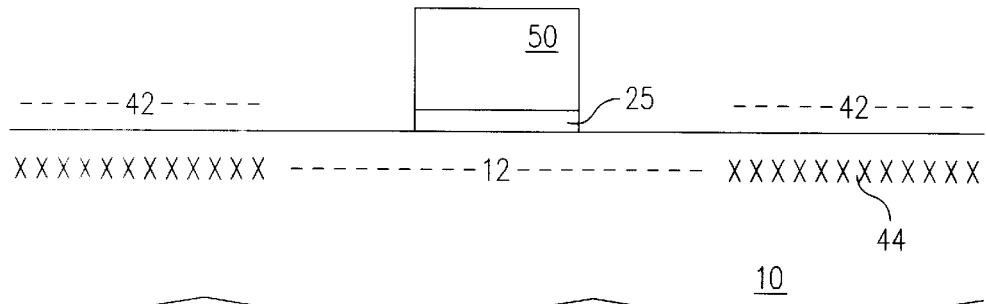
FIGS. 2A–2C are cross-sectional views of subsequent stages in the fabrication of an embodiment of the present invention.

Turning now to FIG. 2A, a cross-sectional view of the embodiment of FIG. 1B at a subsequent step in the fabrication of the transistor is shown. Implant mask 32, and if formed optional capping layer 20, have been removed using conventional processing. A gate structure 55 is formed overlying a portion of active area 12. Gate structure 55 encompasses a gate dielectric 25 and a gate electrode 50.

Typically gate dielectric 25 is a silicon oxide material having a thickness between approximately 3–10 nm and is formed using a thermal oxidation process. For example, a dry oxidation process employing a temperature of approximately 1000 degrees Centigrade (°C.) is conveniently used. While such a thermally formed silicon oxide is typical, other appropriate materials, thicknesses or methods of forming can be employed for gate dielectric 25. Thus, a composite layer of CVD oxide and thermal oxide, or a layer of nitrided oxide material are also appropriate for dielectric 25.

Gate electrode 50 is typically a CVD polysilicon material having a thickness of between approximately 200–400 nm, formed overlying gate dielectric 25, although other appropriate thickness' can be used. In addition, while gate electrode 50 is typically a CVD polysilicon material, in some embodiments, other appropriate materials are employed. For example, gate electrode 50 can be formed from amorphous silicon or a combination of amorphous silicon and polysilicon. In some embodiments, gate electrode 50 is formed using a doped polysilicon material (in-situ doping) over gate dielectric layer 25. In some embodiments, gate electrode 50 is doped concurrently with the doping of other regions, for example subsequently formed source and drain regions (see FIG. 2C).

Figure 2B:
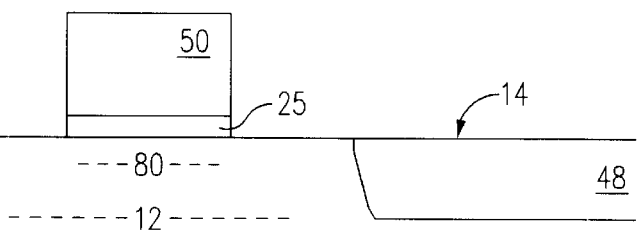

Referring to FIG. 2B, dielectric regions 48 are formed from implanted regions 44 (FIG. 2A). In some embodiments in accordance with the present invention, conversion of implanted regions 44 to dielectric isolation regions 48 is accomplished by a high temperature anneal of wafer 10 in an inert atmosphere, e.g. argon (Ar) or nitrogen ($N_2$). Temperatures in excess of 1100° C. are desirable for such a conversion and higher temperatures preferred. As known, annealing time varies inversely with annealing temperature. Thus, where at 1100° C. between 1–4 hours are needed to complete conversion of implanted regions 44 to dielectric isolation regions 48, at higher temperatures, less time is required. It will be understood that conversion of implanted regions 44 to dielectric isolation regions 48 means that implanted ions 40 have diffused throughout region 48 to provide for reaction with the silicon of substrate 10 within regions 42. As implantation of ions 40 creates implant damage within regions 42, diffusion of ions 40 within regions 42 occurs more rapidly than in non-implanted regions. Thus, where high temperatures are employed, the short times required when using such high temperatures advantageously limits diffusion of ions 40 to within the damaged regions 42. In addition to diffusion, the high temperature anneal provides that where ions 40 within regions 42 are oxygen, silicon oxide is formed; where ions 40 within regions 42 are nitrogen, silicon nitride is formed; and where both oxygen and nitrogen ions are implanted, both silicon oxide and silicon nitride are formed. Thus, implantation of ions 40 into regions 42 conveniently provides for the rapid diffusion of ions 40 within region 42 and allows for the formation of silicon oxide and/or silicon nitride to create dielectric isolation regions 48 that extend upward to surface 14. In some embodiments, the high temperature anneal is performed with oxygen present during some or all of the anneal time. For example, where oxygen is present during the entire anneal, a trace amount, e.g. less than 1 or 2 percent (%) is employed. In some embodiments where oxygen is present during only a portion of the anneal time, higher concentrations are employed. In this manner, a small, predetermined amount of silicon oxide is grown at the surface of the exposed areas of substrate 10 and gate electrode 50. Typically, the amount of oxygen present and/or the time during the anneal the oxygen is present is controlled to provide that this predetermined amount of silicon oxide is less than 10 nm of silicon oxide at the exposed substrate surface. However, other appropriate amounts of silicon oxide can be grown. Where the aforementioned anneal is performed in an inert atmosphere, no oxidation of substrate 10 occurs and hence surface 14 over regions 48 remains planar with surface 14 over active area 12. Where the aforementioned anneal is performed in an atmosphere having a trace amount of oxygen present as described above, the minimal amount of oxidation of substrate 10 that is allowed provides that surface 14 over regions 48 remains essentially planar with surface 14 over active area 12. For example, where 10 nm of silicon oxide is grown, only approximately 5 nm of silicon from surface 14 over region 48 is consumed thus providing an essentially planar surface 14.

Figure 2C:
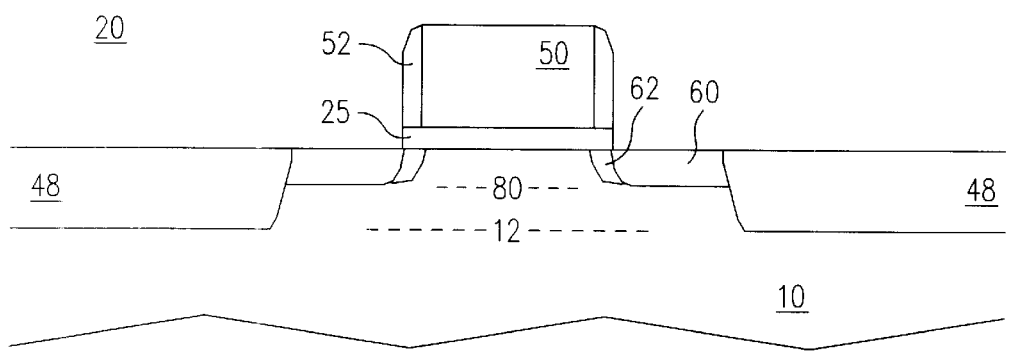

Turning now to FIG. 2C, a transistor 20 is depicted subsequent to the formation of source and drain (S/D) regions 60 having lightly doped drain (LDD) regions 62. It will be understood that S/D regions 60 with LDD regions 62 are shown for illustrative purposes only. Thus, in some embodiments, LDD regions 62 are not formed and in other embodiments other S/D tailoring processes, e.g. graded drains or doubly diffused drains, are employed. S/D regions 60 with LDD regions 62 define channel region 80 under gate structure 55 (FIG. 2A) and are formed using conventional implantation processing. Thus, LDD regions 62 are formed self-aligned to gate electrode 50 and S/D regions 60 are formed self-aligned to spacers 52. In some embodiments of the present invention, any of the various channel tailoring processes are performed subsequent to forming dielectric region 48, e.g. a threshold voltage adjust implant. In some embodiments, one or more well regions are formed in the manner described in co-pending application "CMOS PROCESS FORMING WELLS AFTER GATE FORMATION", Ser. No. 08/751,464, filed Nov. 19, 1996, assigned to the assignee of the present application and incorporated by reference herein.

Thus, embodiments of the present invention have been shown that provide dielectric isolation regions 48 formed without oxidation of substrate 10, or with a minimal amount of oxidation of substrate 10, and hence provide an essentially planar upper surface 14 of substrate 10. It will be also be apparent that this absence of the typical thermal oxidation step used in conventional LOCOS processing to form several hundreds of nanometers of silicon oxide eliminates the oxide thinning problem seen with such conventional LOCOS processing. Also, this absence of the conventional thermal oxidation step eliminates the "Bird's Beak" regions typical to common LOCOS technology from being formed within isolation regions 48. Thus, no "Bird's Beak" extends into active area 12 and device performance is not affected. In addition, unlike STI technology, no complex silicon-etch and refill processes are required to form dielectric regions 48. And, as dielectric regions 48 are formed using a high temperature anneal step, essentially no stress is associated with dielectric isolation regions 48. This in contrast to what is often found with isolation regions formed using STI techniques.

Figure 3A:
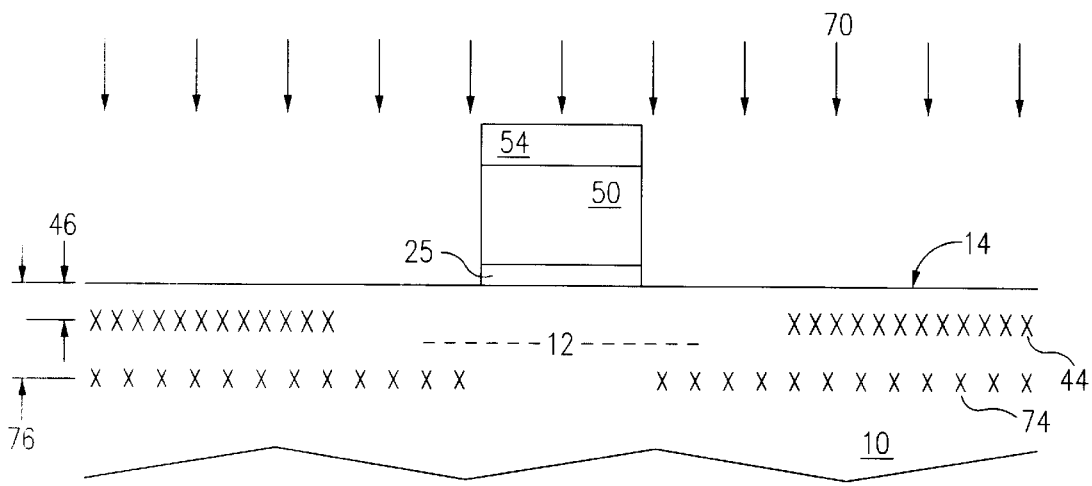
FIGS. 3A–3C are cross-sectional views of subsequent stages in the fabrication of another embodiment of the present invention.

Turning now to FIG. 3A, a cross-sectional view of the embodiment of FIG. 1B is shown at a subsequent step in the formation of another embodiment of the present invention. As discussed with respect to FIG. 2A, implant mask 32 and optional capping layer 20, if formed, have been removed. The embodiment of FIG. 3A has a gate structure 57 (FIG. 3B) formed overlying a portion of active area 12 and a buried implant region 74 formed in substrate 10 as depicted.

Buried implanted regions 74 are formed by implanting ions 70 into substrate 10, wherein gate structure 57 serves to mask a portion of active area 12. As described previously for ions 40, ions 70 also encompass oxygen ($O^+$) ions, nitrogen ($N^+$) ions or a combination of $O^+$ and $N^+$ ions in sufficient quantity, or dose, to form buried dielectric regions 78 (FIG. 3B), as will be discussed. In addition, an implant energy is used to implant ions 70 that is sufficient to position implanted regions 74 at predetermined depth 76 below surface 14 of substrate 10. As depicted, depth 76 is greater than depth 46 and regions 74 are disposed below implanted regions 44. With regard to the quantity of ions, or dose, it has been found that a dose in the range of $1.5-2.5\times10^{18}$ ions/cm$^2$ is convenient. With regard to the implant energy, where predetermined depth 76 is for example, approximately 400 nm, an energy exceeding 100 KeV is appropriate and approximately 150 KeV typical. In some embodiments in accordance with the present invention, multiple implants are employed to form regions 74 in a manner analogous to that described previously for regions 44 (FIG. 1B).

In some embodiments of the present invention, gate structure 57 has a gate masking layer 54 disposed on gate electrode 50. As one of ordinary skill in the art will know, for any specific implant energy employed, gate masking layer 54 need have a minimum thickness to block implantation of ions 70 into gate electrode 50. For example, a thickness of approximately 200–300 nm is appropriate for gate masking layer 54 where an implant energy of 150 KeV is employed to implant ions 70. In some embodiments, gate-masking layer 54 is not employed and a self-masking gate electrode (not shown) is used. The masking properties of the self-masking electrode are provided by increasing the gate electrode thickness. Thus where gate electrode 50, in embodiments employing gate masking layer 54, is typically a polysilicon material having a thickness between approximately 200–400 nm, the self-masking gate electrode is formed using a polysilicon layer approximately 400–700 nm thick. In this manner, an upper portion (not shown) of the self-masking gate electrode essentially performs the function of gate masking layer 54.

Figure 3B:
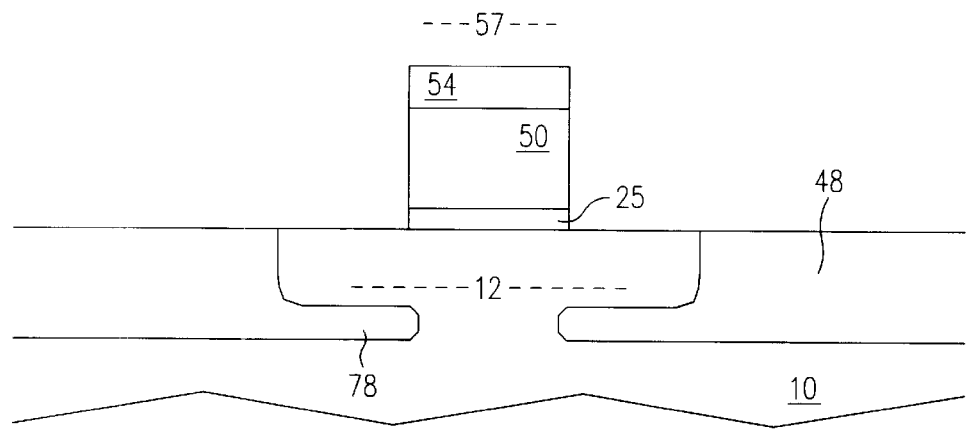

Turning now to FIG. 3B, dielectric isolation regions 48 are formed from implanted regions 44 (FIG. 3A) and buried dielectric regions 78 are formed from buried implanted regions 74. Conversion of implanted regions 44 and 74 to dielectric regions 48 and 78, respectively, is accomplished by a high temperature anneal of wafer 10 in an inert atmosphere, as previously described. Thus, as before, temperatures in excess of 1100° C. are desirable for such a conversion and higher temperatures preferred. As known, annealing time varies inversely with annealing temperature. Thus, where at 1100° C. between 1–4 hours are needed to complete conversion of implanted regions 44 and 74 to dielectric regions 48 and 78, respectively, at higher temperatures less time is required. It will be understood that conversion of implanted regions 44 and 74 to dielectric regions 48 and 78 means that implanted ions 40 and 70 have diffused throughout regions 48 and 78. As previously discussed with respect to regions 42, implant damage above buried implanted regions 74 is present and thus diffusion into these damaged areas occurs more rapidly than into non-damaged regions. Hence, where high temperatures are employed, short times are required to advantageously limit diffusion of ions 70. In addition, for embodiments that employ implantation of ions 70 to form buried implanted regions 74, multiple implants to form implanted regions 44 is desirable. Such multiple implants place peak concentrations of ions 40 and 70 at varying positions within implanted regions 44 and 74, respectively. Thus shorter anneal times are required to diffuse such ions through their respective implanted regions to form isolation regions 48 and 78. In addition, as previously described, the anneal is performed in either an inert atmosphere or an atmosphere having only a trace amount of oxygen, therefore little or no oxidation of surface 14 of substrate 10 or of gate electrode 50 occurs. In this manner, surface 14 over regions 48 remains planar with surface 14 over active area 12.

Figure 3C:
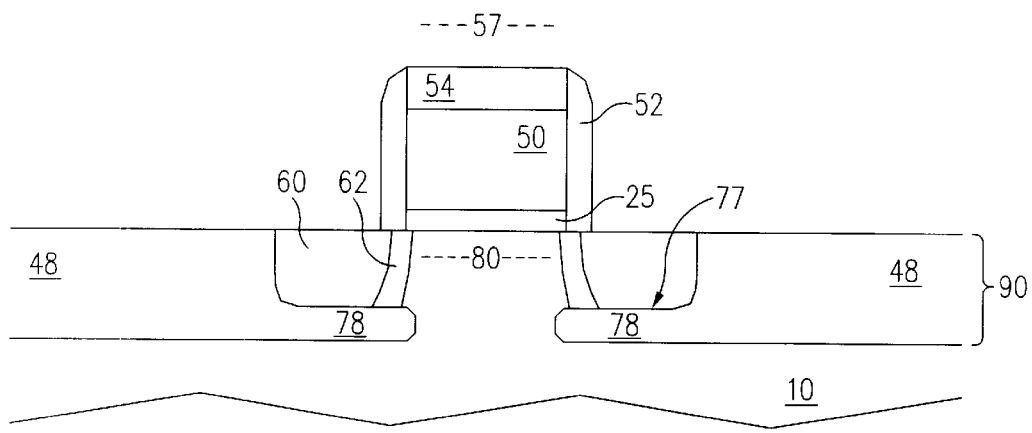

Turning now to FIG. 3C, a transistor 22 is depicted subsequent to the formation of source and drain (S/D) regions 60 having lightly doped drain (LDD) regions 62. As previously described, it will be understood that S/D regions 60 with LDD regions 62 are shown for illustrative purposes only and in some embodiments, other S/D tailoring processes, e.g. graded drains or doubly diffused drains rather than LDD regions 62, are employed. As depicted, S/D regions 60 with LDD regions 62 define channel region 80 under gate structure 57. LDD regions 62 are formed self-aligned to gate electrode 50 and S/D regions 60 are formed self-aligned to spacers 52 using conventional processing and extend into substrate 10 to the upper boundary 77 of regions 78. In addition to S/D engineering, some embodiments of the present invention employ any of the various channel tailoring processes subsequent to forming dielectric regions 48 and 78, e.g. a threshold voltage adjust implant. In some embodiments, one or more well regions are formed in the manner previously described and as previously incorporated herein by reference.

Thus, additional embodiments of the present invention have been shown that provide dielectric isolation regions 48 formed without oxidation of substrate 10 and hence provide an essentially planar upper surface of substrate 10. These embodiments additionally provide buried dielectric regions 78 to reduce leakage currents and parasitic capacitance through isolation of S/D regions 60 with the common substrate, i.e. that portion of substrate 10 below regions 78. Thus the benefits previously described with respect to regions 48 are realized in addition to these addition benefits of reduced leakage and parasitic capacitance. It will also be apparent to those of skill in the art that the combination of regions 48 and 78 offer a significant advantage over Varker et al. in that no complex STI processing is required and the associated non-planarity and stress is avoided.

It will be apparent that improved methods of forming isolation regions have thus been provided that are particularly suited for deep sub-micron semiconductor devices in that the problems associated with LOCOS or STI methods are reduced and/or eliminated. In addition, these improved methods are shown to result in an essentially planar device structure. Thus this planar surface enhances the manufacturability of devices that employ deep sub-micron design rules by reducing the depth of focus required to accurately reproduce a pattern on the substrate. Finally, it should be apparent that the improved methods and structures described herein reduce process complexity, as compared to STI methods, and therefore provide for both reduced manufacturing costs and increased process and device yields.

I claim:

1. A method for fabricating an integrated circuit comprising:

providing a semiconductor substrate having an upper surface;

forming an implant mask overlying a first region of said semiconductor substrate, implanting oxygen and/or nitrogen ions into a second region of said semiconductor substrate to a first depth;

removing said implant mask;

forming a gate electrode structure overlying a portion of said first region; implanting oxygen and/or nitrogen into said first region to a second depth greater than said first depth, wherein a portion of said first region is masked by said gate structure; heating said semiconductor substrate to diffuse and react said oxygen and/or nitrogen ions in said first region and said second region to form a dielectric region in said second region extending to said upper surface and a buried dielectric region in said first region; and forming source and drain regions in said first region, adjacent said gate structure.

2. The method of claim 1 wherein implanting oxygen and/or nitrogen into said first region comprises implanting with an energy greater than any energy used to implant oxygen and/or nitrogen into said second region.

3. The method of claim 1 wherein heating the semiconductor substrate comprises heating to a temperature in excess of 1100 degrees Centigrade.

4. The method of claim 1 wherein implanting oxygen and/or nitrogen into said second region comprises performing at least two sequential oxygen and/or nitrogen implants, each implant having a different implant energy.

5. The method of claim 1 wherein heating said semiconductor substrate comprises heating in an inert atmosphere comprising argon or nitrogen.

6. A method of forming an isolation region comprising:

providing a semiconductor wafer having an upper surface;

masking a first region of said upper surface, wherein a second region of said upper surface is exposed;

forming a first implanted region within said semiconductor substrate by implanting oxygen and/or nitrogen ions through said exposed second region of said upper surface, wherein said first implanted region is aligned with said exposed second region;

forming a gate electrode structure overlying a portion of said first region of said upper surface, forming a second implanted region within said semiconductor substrate by implanting oxygen and/or nitrogen through portions of said first region of said upper surface adjacent to said gate electrode structure, wherein said second implanted region is between said gate electrode structure and said first implanted region;

heating said first and second implanted regions to a temperature sufficiently high to convert said first implanted region to a dielectric isolation region comprising silicon oxide and/or silicon nitride and extending from said upper surface of said semiconductor wafer to a first depth, and said second implanted region to a buried dielectric region extending to a second depth greater than said first depth; and forming source and drain regions adjacent said gate electrode structure, said source and drain regions being aligned with said gate structures.

7. The method of claim 6 wherein forming a first implanted region comprises performing at least two sequential oxygen and/or nitrogen implants, each of said implants having a different implant energy.

8. The method of claim 6 wherein forming a first implanted region and a second implanted region comprises performing first and second implants each with an implant dose of at least approximately $1.5 \times 10^{18}$ ions/cm$^2$.

9. The method of claim 6 wherein said heating is performed at a temperature in excess of 1100 degrees Centigrade.

10. The method of claim 9 wherein said heating is performed in an atmosphere comprising argon and/or nitrogen and having less than about 2% oxygen.

11. The method of claim 10 wherein said heating further comprises heating for a period of time sufficient to grow approximately 10 nm of silicon oxide on said upper surface.

* * * * *